(12) United States Patent
Anderson

(10) Patent No.: US 7,622,793 B2
(45) Date of Patent: Nov. 24, 2009

(54) FLIP CHIP SHIELDED RF I/O LAND GRID ARRAY PACKAGE

(76) Inventor: Richard A. Anderson, 116 George St. North, Attleborough, MA (US) 01581

( * ) Notice: Subject to any disclaimer, the term of this patent is extended or adjusted under 35 U.S.C. 154(b) by 133 days.

(21) Appl. No.: 11/643,144

(22) Filed: Dec. 21, 2006

(65) Prior Publication Data
US 2008/0150094 A1 Jun. 26, 2008

(51) Int. Cl.
*H01L 23/552* (2006.01)
(52) U.S. Cl. .................. 257/659; 257/678; 257/E23.114
(58) Field of Classification Search .................. 257/659, 257/690, 790, 786, 773, 207, 208, 775, E23.114, 257/E21.052, 123, 666, 778, 780; 438/123
See application file for complete search history.

(56) References Cited

U.S. PATENT DOCUMENTS 5,686,764 A 11/1997 Fulcher
5,994,766 A 11/1999 Shenoy et al.
6,495,915 B1 12/2002 Hsieh et al.
6,639,322 B1 10/2003 Welstand
6,686,649 B1 * 2/2004 Mathews et al. ............ 257/659
6,841,886 B2 1/2005 Nakata et al.
6,870,273 B2 * 3/2005 Tao et al. .................... 257/778

OTHER PUBLICATIONS

Heinrich, Wolfgan, "The Flip-Chip Approach for Millimeter-Wave Packaging", IEEE Microwave Magazine, Sep. 2005, pp. 36-45.

* cited by examiner

*Primary Examiner*—Sue Purvis
*Assistant Examiner*—Selim Ahmed

(57) ABSTRACT

A novel apparatus and method for providing a radio frequency ("RF") input/output ("I/O") land grid array ("LGA") package structure. The package structure comprises grounded shield rings surrounding free-standing RF I/O interconnects. The free-standing RF I/O interconnects eliminate long leads and the shield rings provide ground protection thereby minimizing losses, inductance, leakage, and crosstalk, and improving performance.

14 Claims, 11 Drawing Sheets

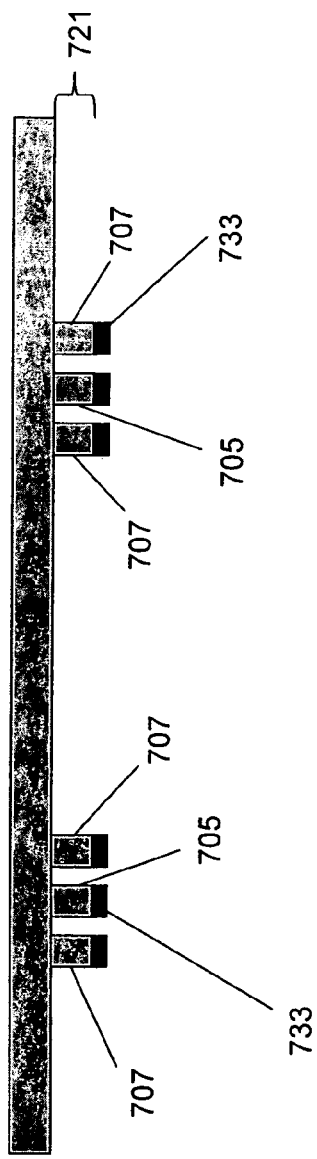

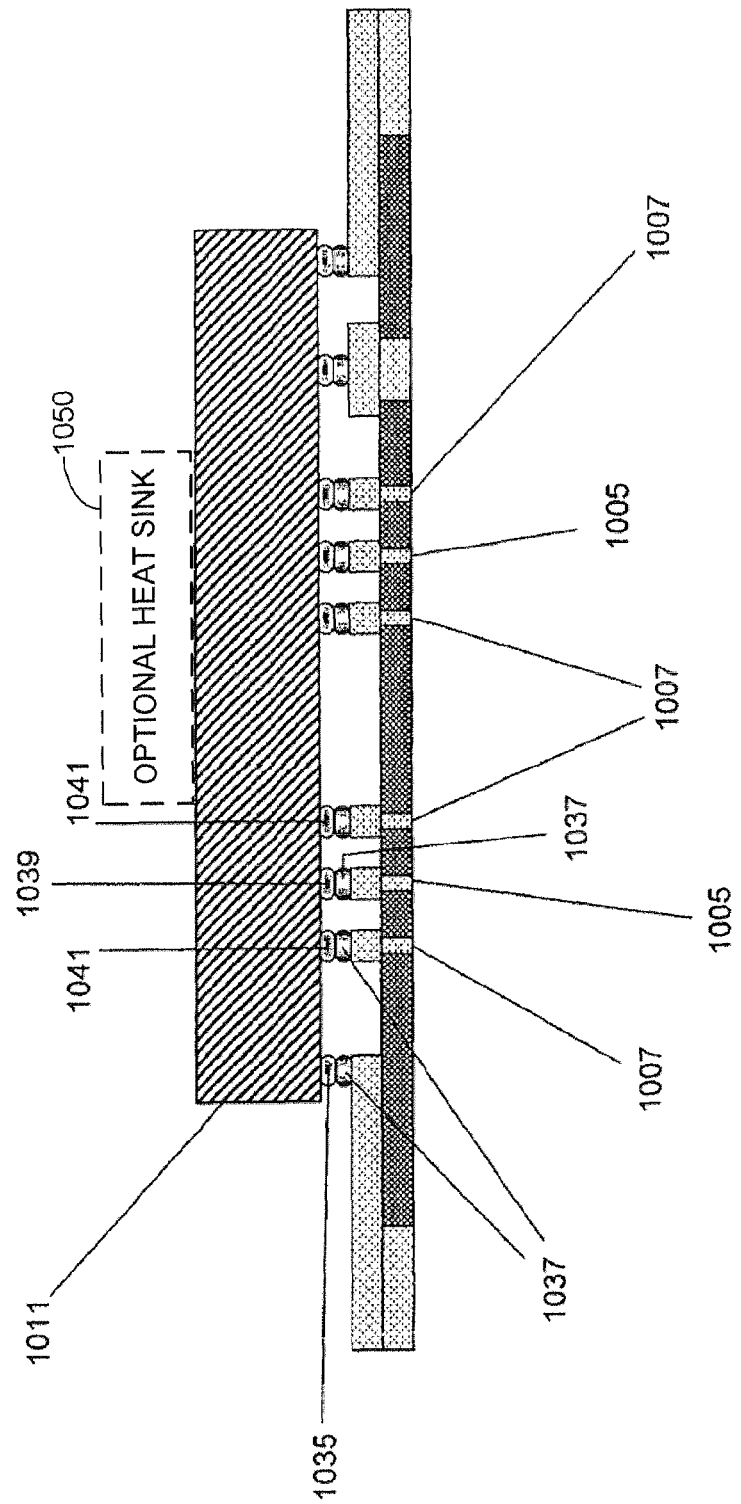

US 7,622,793 B2

FLIP CHIP SHIELDED RF I/O LAND GRID ARRAY PACKAGE

FIELD OF INVENTION

The present invention relates generally to radio frequency input-output (RF I/O) land grid array packages. More particularly, the present invention relates to a method and apparatus for providing a package structure with a shield ring around free-standing RF I/O interconnects between a flip chip and a circuit board or card substrate.

BACKGROUND

Generally, a land grid array ("LGA") package comprises an integrated circuit ("IC"), a lead-frame for supporting the IC and other packages, a circuit board or card substrate secured to the lead frame, and an interconnect array between the IC and the circuit board or card. A Radio Frequency ("RF") Monolithic Microwave Integrated Circuit ("MMIC") is an IC for use in microwave mixing, power amplification, and low noise amplification. A flip chip is a type of MMIC mounting without using wire bonds.

The flip chip is mounted using solder beads or bumps deposited on chip pads. Typically, a bumped wafer (sliver of semi-conducting material) is cut into individual dice that are to be mounted on lead frames. The MMIC dice are then mounted face down (the chip is flipped) on the lead-frames and the solder is reflowed for bonding. An underfill process is also done where the space between the sides of the die, the first of the MMIC, and the lead-frame is filled.

As is illustrated in FIGS. 1A and 1B, conventional flip chip LGA packages 101, comprise a lead frame 103, a flip chip 111, interconnections 115, and encapsulate. 117. Current industry practice is to etch or stamp a thin piece of metal in order to create a lead frame 103. Thus, the interconnects 115 between the flip chip 111 and the circuit board or card are typically held in place via long, exposed leads to reach the center of the flip chip 111. The long leads cause energy losses, leakage, crosstalk, and inductance.

As illustrated in FIG. 2, in an effort to reduce the negative effects of the long exposed leads, ground bumps 229 on leadframe leads 203 have been incorporated into conventional lead-frame designs as a means of shielding interconnects 205. Ground bumps 229 were formed on the lead-frame leads 203 by soldering or thermocompression and situated on the sides of the RF interconnects 205. However, the size of the bumps affects performance of microwave frequencies. As may be appreciated by those skilled in the art, unless the long interconnect lead is eliminated altogether, the flip chip LGA package will continue to experience losses, inductance, leakage, and crosstalk.

Another attempt to reduce the negative effects of the long exposed leads came with a process of half-etching a front side of a lead frame substrate, molding the etched front side, and then half-etching a back side of the lead frame substrate, as shown by patent Publication No. 2006/0223240 A1. This process, however, fails to provide effective shielding, thus leaving the substrate susceptible to losses, inductance, leakage, and crosstalk.

Accordingly, it is desirable to have a method and apparatus that eliminates long leads and provides adequate interconnect shielding thereby minimizing losses, inductance, leakage, and crosstalk, and improving performance.

SUMMARY OF THE INVENTION

The present invention relates to a land grid array ("LGA") package structure with a shield ring around freestanding radio frequency ("RF") input/output ("I/O") interconnects. The shielded land grid array package comprises a lead-frame substrate defining at least one free-standing radio frequency (RF) interconnect surrounded by at least one shield ring, wherein the at least one free-standing RF interconnect is held in place by an encapsulate. Mounted to the free-standing RF interconnect is at least one flip-chip. The flip chip's RF lead is coupled to the free-standing RF interconnect and the flip chip's ground lead is coupled to the shield ring. An encapsulate is disposed over the lead frame substrate, the free-standing RF interconnect, and the flip chip.

The present invention also relates to a method for providing a LGA package structure with a shield ring around freestanding RF I/O interconnect(s). According to this method, a lead-frame substrate is etched on a first surface (e.g., a bottom surface) so as to define a first portion of at least one RF interconnect and a first portion of at least one shield ring that surrounds the at least one RF interconnect. Next, the etched first surface is over-molded with a suitable encapsulate. The second surface (e.g., a top surface) of the lead-frame substrate is then etched to complement the etched first surface so as to define at least one free-standing RF interconnect surrounded by the at least one shield ring. Preferably, at least one flip chip is mounted to the lead-frame substrate via coupling an RF lead of the at least one flip chip to the at least one free-standing RF interconnect and coupling a ground lead of the at least one flip chip to the at least one shield ring. The second surface and the at least one flip chip is over-molded to provide a flip chip shielded RF I/O land grid array package.

BRIEF DESCRIPTION OF THE DRAWINGS

The present invention is best understood from a reading of the following detailed description, taken in conjunction with the accompanying Figures in the drawings wherein:

FIG. 7B illustrates a cross-section of FIG. 5A;

FIG. 10 illustrates a flip chip mounted to an exemplary lead-frame substrate.

DETAILED DESCRIPTION OF THE PREFERRED EMBODIMENTS

Described herein is a novel flip chip shielded radio frequency ("RF") input/output ("I/O") land grid array ("LGA") package. Unlike existing packages, the package structure of the present invention offers at least one free-standing RF interconnect surrounded by a shield ring. The shield ring surrounding the free-standing RF interconnect eliminates a need for long leads as used in the prior art packages, thereby minimizing losses, inductance, leakage, and crosstalk, and improving performance.

The flip chip shielded RF I/O land grid array package of the present invention comprises, for example, a lead-frame substrate defining at least one free-standing RF interconnect surrounded by at least one shield ring, the at least one free-standing RF interconnect being held in place by a suitable encapsulate; at least one flip chip mounted to the at least one free-standing RF interconnect wherein a flip chip RF lead couples to the at least one free-standing RF interconnect and a flip chip ground lead couples to the shield ring; and a suitable encapsulate disposed over the lead frame substrate, the at least one free-standing RF interconnect, and the at least one flip chip.

Figure 1A:
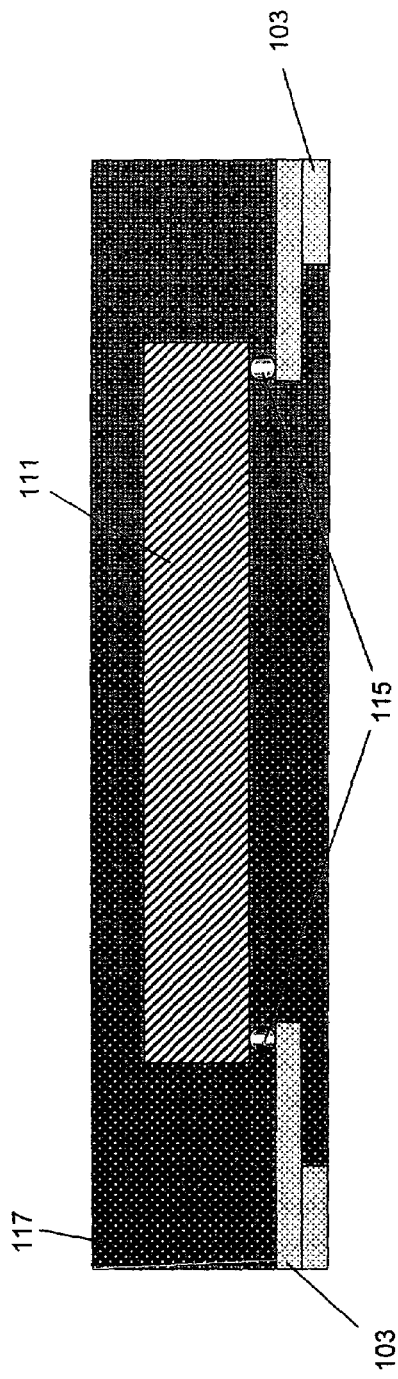
FIGS. 1A and 1B illustrate a conventional flip chip LGA package.
Figure 1B:
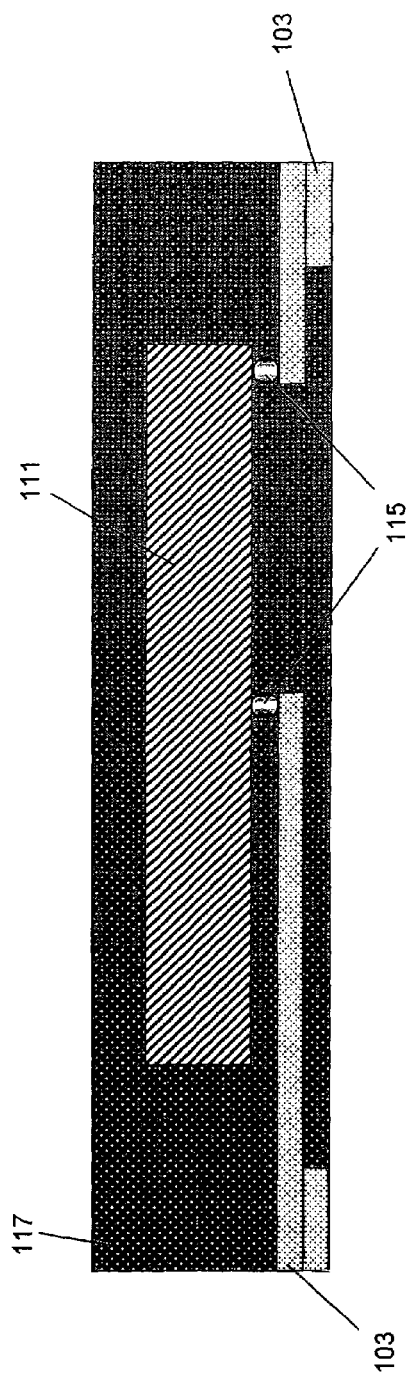
Figure 2:
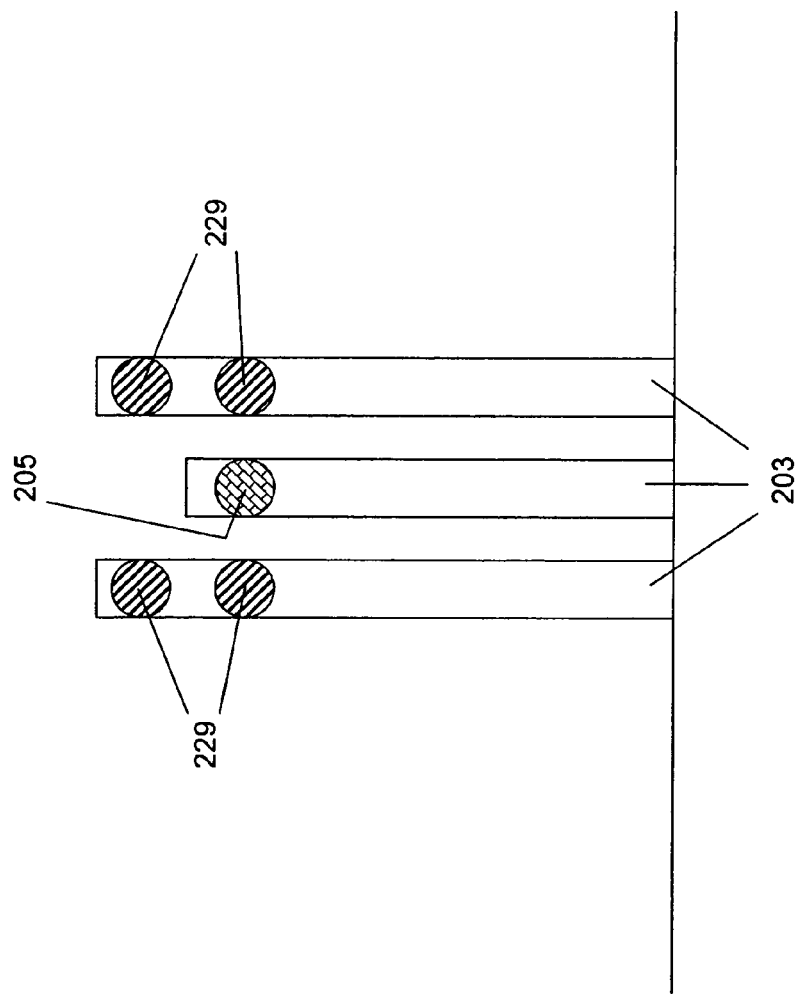
FIG. 2 illustrates a conventional shielding of an RF interconnect.
Figure 3:
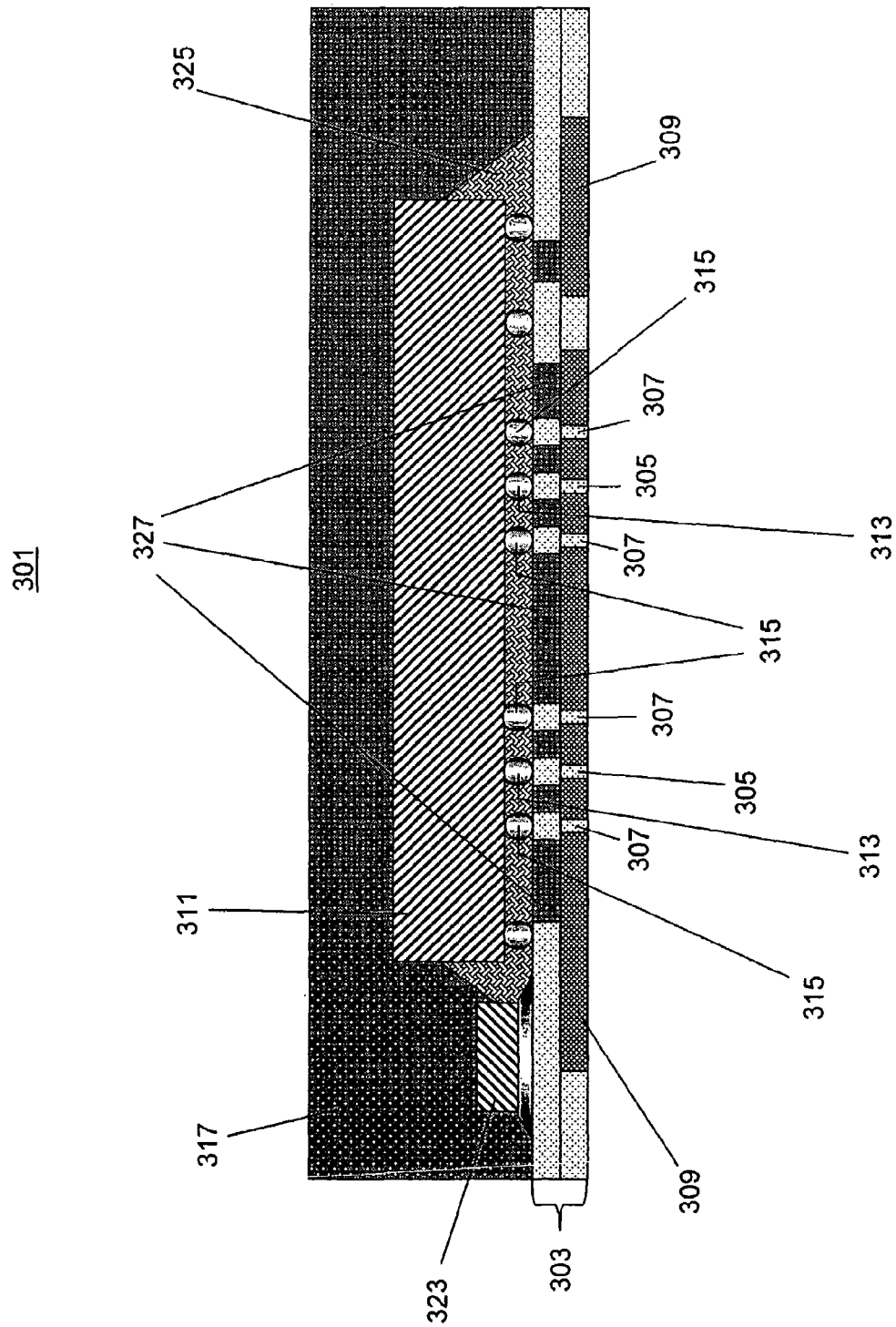
FIG. 3 illustrates an exemplary over-molded flip chip shielded RF I/O land grid array package in accordance with the present invention.

Referring now to FIG. 3, an exemplary over-molded flip chip shielded RF I/O land grid array package 301 in accordance with the present invention is shown. A lead-frame substrate 303 defines at least one free-standing RF interconnect 305 surrounded by at least one shield ring 307. The at least one free-standing RF interconnect 305 is held in place by a suitable encapsulate 309. The at least one flip chip 311 is preferably mounted to the at least one free-standing RF interconnect 305 via a flip chip RF lead 313 coupled to the at least one free-standing RF interconnect 305 and a flip chip ground lead 315 couples to the shield ring 307. A suitable encapsulate 317 engulfs the lead frame substrate 303 and the at least one flip chip 311.

The at least one free-standing RF interconnect 305 surrounded by at least one shield ring 307; and the at least one flip chip 311 mounted to the at least one free-standing RF interconnect 305, wherein a flip chip RF lead 313 couples to the at least one free-standing RF interconnect 305, and a flip chip ground lead 315 couples to the shield ring 307; eliminate previously needed long leads and provide adequate interconnect shielding thereby minimizing losses, inductance, leakage, and crosstalk, and improving performance.

The lead frame substrate 303 may be made of any suitable material known in the art, such as for example copper, copper alloy, nickel-iron alloy, or nickel-cobalt alloy. The lead frame substrate 303 can also contain a slot or slots in either surface for facilitating bonding of the suitable encapsulate. The slots enable, for example, the suitable encapsulate to reach internal voids with fewer obstacles. The shield ring 307 may be a continuous shield ring or a split shield ring. The split ring also facilitates flowing the suitable encapsulate to reach internal voids with fewer obstacles. Further, the shield ring 307 may be circular or polygonal in shape depending upon design and manufacturing needs. A symmetrical design may be less costly and quicker to mass produce, but asymmetrical designs could improve performance.

The at least one flip chip 311 may comprise any suitable flip chip known in the art. Preferably, the flip chip 311 is an integrated circuit ("IC"). More preferably, the flip chip 311 is a Monolithic Microwave Integrated Circuit ("MMIC"). MMIC's are used for microwave mixing, power amplification, and low noise amplification and work well with the present invention. Further, the flip chip 311 performance may be improved by adding a heat sink to the flip chip 311, as is known in the art. As discussed above, the suitable encapsulate 317 may either be flowed to expose the back side of the flip chip 311 or be back grinded to expose the back side of the flip chip 311. The heat sink can then be added to absorb and dissipate heat using thermal contact as is known in the art.

Optionally, a package component 323 may be included in the flip chip shielded RF I/O land grid array package 301. The package component 323 may be any suitable package component desired for a particular design, such as for example a capacitor, a resistor, an inductor, etc.

Also, included in the package 301 is an optional layer of underfill 325 between the lead-frame substrate 303 and the at least one flip chip 311. The layer of underfill 325 helps strengthen the flip chip 311 and lead frame substrate 303 during the manufacturing process and in use. In addition, an added optional layer of suitable encapsulate 327 used to strengthen the lead-frame substrate 303 and to facilitate placing the aforementioned suitable encapsulate 317 is included in the package 301. If the optional additional layer of suitable encapsulate 327 is not placed separately, that void may be filled with the suitable encapsulate 317. The suitable encapsulates 317, 309, 327, and underfill 325 may be any suitable encapsulate known in the art, such as for example plastic, elastomer, polymer, polymer matrix composite, co-polymer, etc.

Figure 4:
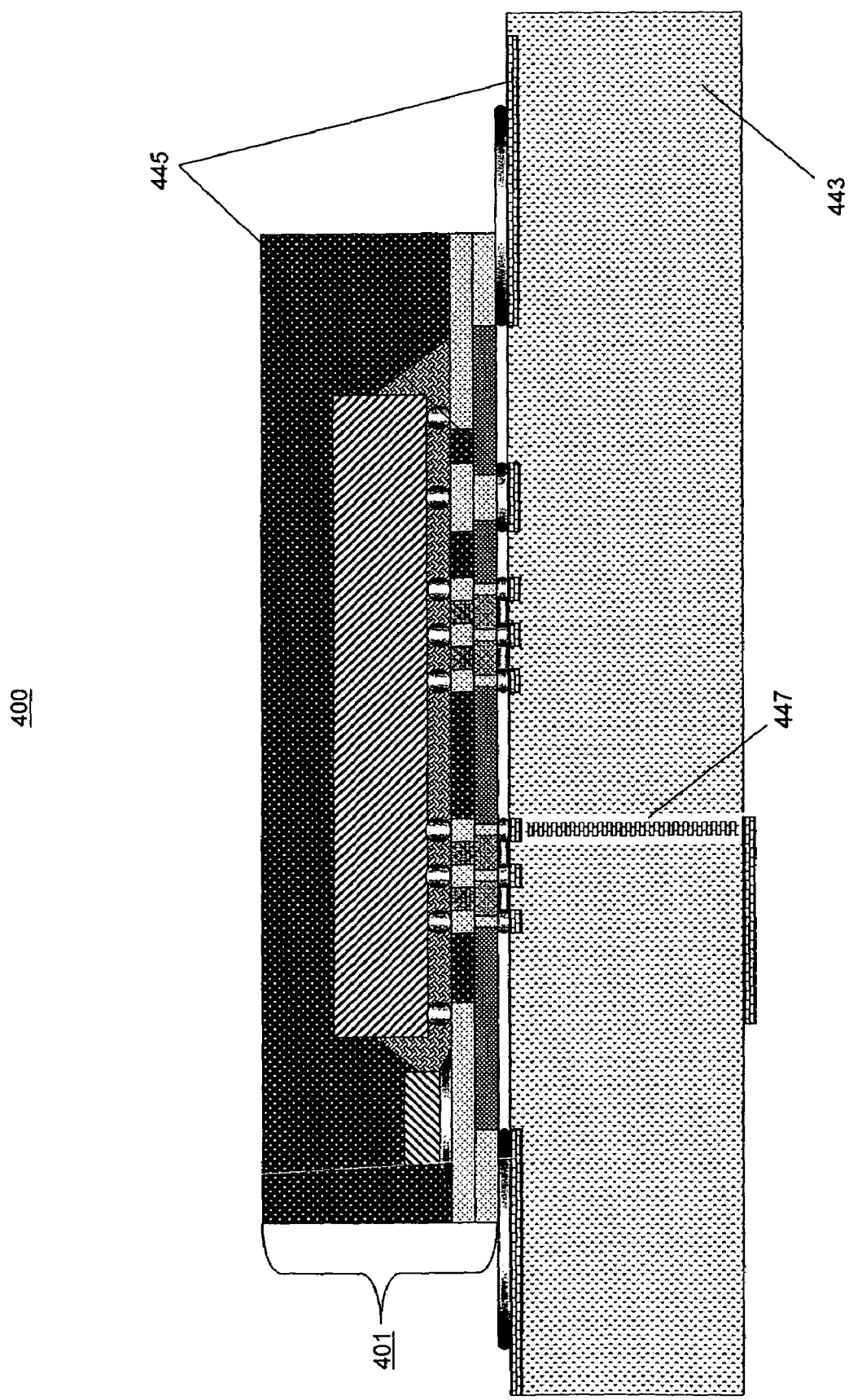
FIG. 4 illustrates an exemplary over-molded flip chip shielded RF I/O land grid array package in accordance with the present invention.

Referring now to FIG. 4, an exemplary implementation 400 of an over-molded flip chip shielded RF I/O land grid array package 401, in accordance with the present invention, is shown. FIG. 4 shows an example of the over-molded flip chip shielded RF I/O land grid array package 401 connected to a circuit board substrate 443. The circuit board substrate 443 mechanically supports and electrically connects electronic components. In the present implementation 400, the connections are solder connections with circuit traces 445, although the connection may be made by any suitable means known in the art. Also shown is a substrate via 447 to couple a signal from one node to another.

The present invention also relates to a novel method of providing a shielded land grid array package. In a preferred embodiment, the package structure of the present invention comprises a lead-frame defining at least one free-standing RF interconnect surrounded by at least one shield ring, at least one flip chip, and suitable encapsulate. Providing such a package structure may comprise, for example, etching a first surface (e.g., a bottom surface) of a substrate to define a portion of at least one RF interconnect and a portion of at least one corresponding shield ring; over-molding the etched first surface; etching a second surface (e.g. a top surface) of the substrate to compliment the first surface, thereby defining at least one free-standing RF interconnect surrounded by at least one shield ring; mounting a flip chip and/or other package components to the second surface; and over-molding the second surface, flip chip, and/or other components.

Alternatively, the flip chip and/or other package components may be mounted to the first etched surface before or after over-molding the first surface, and prior to etching the second surface.

Figure 5:
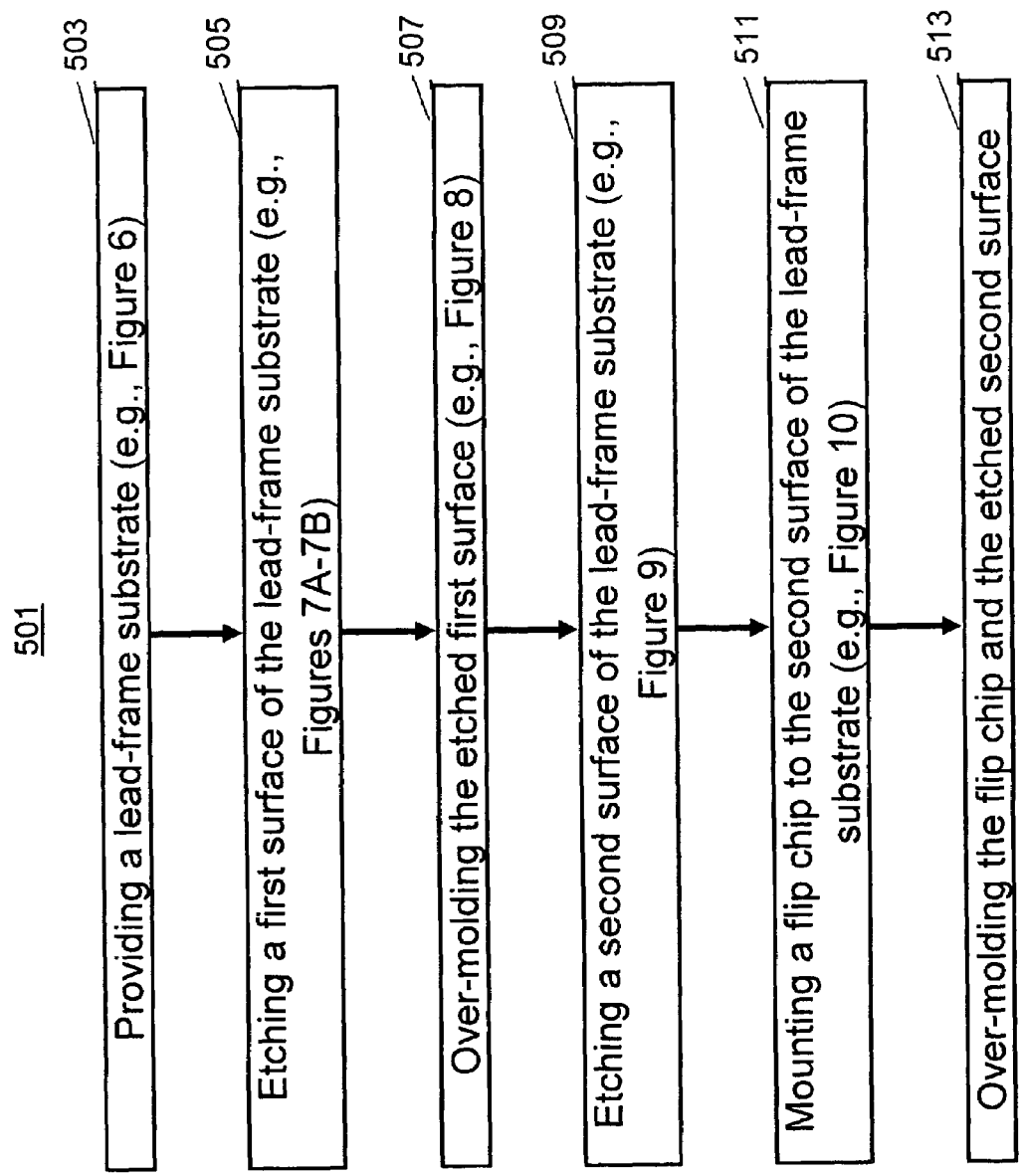
FIG. 5 illustrates a flow diagram of a method of providing a flip chip shielded RF I/O land grid array package in accordance with the present invention.

Referring now to FIG. 5, a flow diagram is shown illustrating a method 501 of providing a flip chip shielded RF I/O land grid array package in accordance with the present invention. The method 501 begins at step 503, wherein a lead-frame substrate is provided. The lead-frame substrate may be made of any suitable material known in the art, for example, copper, copper alloy, nickel-iron alloy, and nickel-cobalt alloy.

Figure 6:
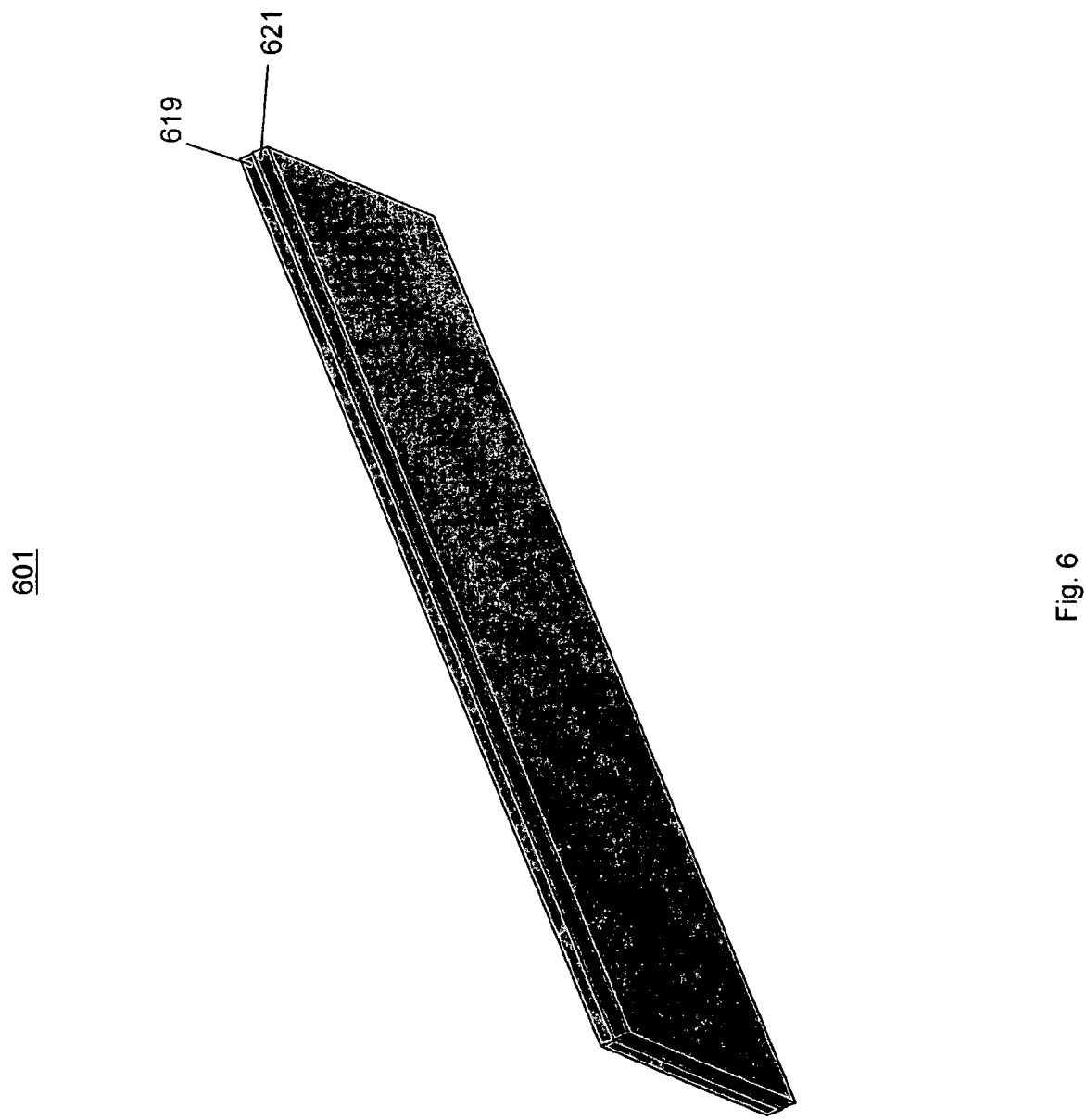
FIG. 6 illustrates an exemplary lead-frame substrate.

Referring briefly to FIG. 6, an exemplary lead-frame substrate 601 is shown comprising a first surface 619 and a second surface 621, shaded differently for clarity. As used herein, the term "surface" is used to describe a top or bottom portion and/or area of a substrate. As such, the surface 621 may be referred to as a top surface, portion, or area, and the second surface 619 as a bottom surface, portion or area of the lead frame substrate 601, or vice versa.

Referring again to FIG. 5, once a lead-frame substrate is provided (step 503), a first surface of the lead-frame substrate is etched (step 505) so as to define a first portion of at least one radio frequency (RF) interconnect and a first portion of at least one shield ring that surrounds the at least one RF interconnect. This first surface may be etched according to conventional etching procedures, such as for example, photomasking, contact and screen printing, or adhesive transfer masking. If the conventional etching procedures leave a masking layer, the masking layer may be strip resisted, as is known in the art. Further, step 505 can include etching slots in the first surface of the lead-frame substrate to facilitate later molding steps. Optionally, to facilitate molding, the at least one shield ring may be split to facilitate later molding steps by allowing mold to more easily reach the void between the at least one shield ring and the at least one RF interconnect.

Figure 7A:
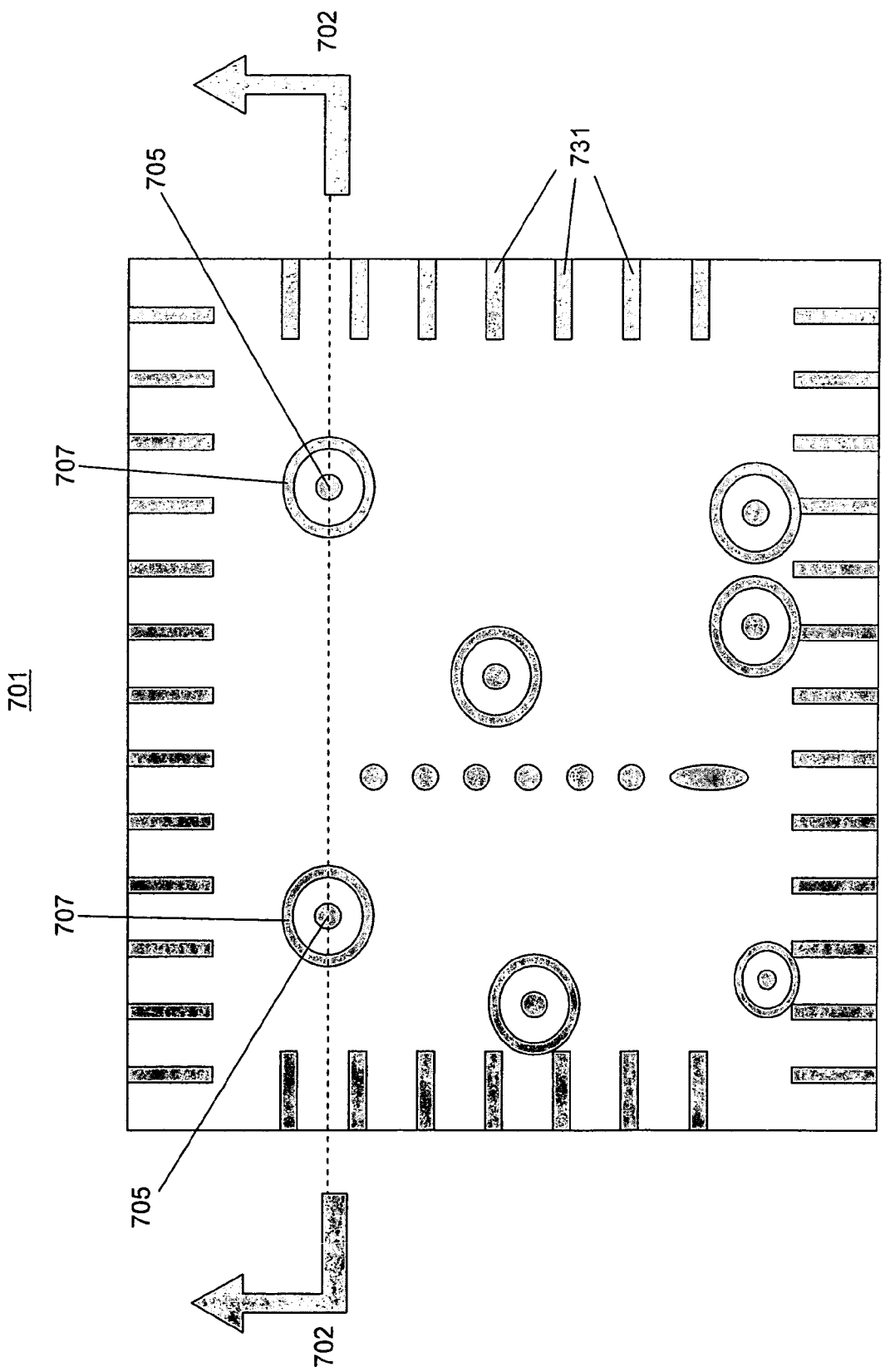
FIG. 7A illustrates an exemplary lead-frame substrate with an etched first surface.

Referring now to FIG. 7A, an exemplary lead-frame substrate 701 with an etched first surface is shown. The etching defines a first portion of at least one RF interconnect 705, and a first portion of at least one shield ring 707 that surrounds the first portion of the at least one RF interconnect 705. Optional etched slots 731 are also included in and exemplary substrate 701 facilitating later molding steps.

Referring now to FIG. 7B, a cross sectional view 702-702 of the etched first surface 721 (e.g., bottom surface) of the exemplary lead-frame substrate 701 is shown. The cross section 702-702 illustrates the first portion of the at least one RF interconnect 705 and the first portion of the at least one shield ring 707 that surrounds the first portion of the at least one RF interconnect 705. Capping the first portion of the at least one RF interconnect 705 and the first portion of the at least one shield ring 707 may be a masking layer 733. The masking layer 733 may be strip resisted at some point following etching, as is known in the art.

Referring again to FIG. 5, the next step of the method 501 is over-molding the etched first surface (step 507) with a suitable encapsulate. This over-molding step 507 may be performed by any means known in the art, such as for example pour molding, injection molding, transfer molding, extrusion molding, and sol-gel deposit molding. Similarly, the suitable encapsulate may be any suitable material known in the art, such as for example plastic, elastomer, polymer, polymer matrix composite, or co-polymer.

Figure 8:
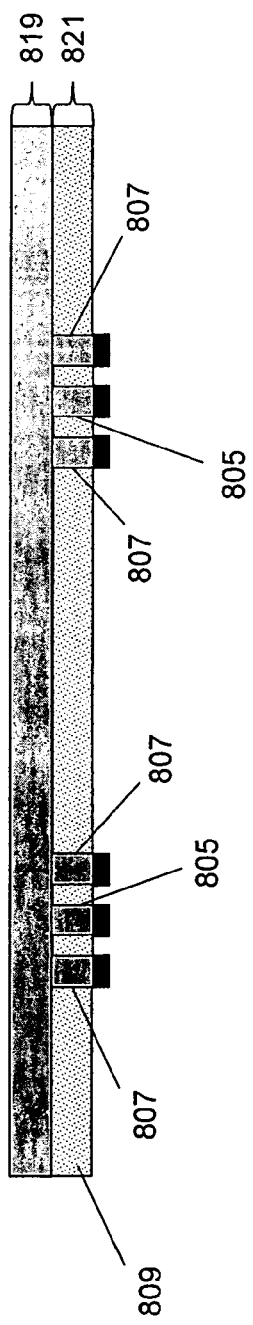
FIG. 8 illustrates a cross section of an exemplary lead-frame substrate with an etched and molded first surface.

Referring now to FIG. 8, a cross section of an exemplary lead-frame substrate 801 with an etched and molded first surface 821 (e.g., bottom surface) is shown. As FIG. 6 illustrates, a suitable encapsulate 809 fills voids between a first portion of at least one RF interconnect 805, a first portion of at least one shield ring 807, and a second surface 819 (e.g., top surface) of the lead-frame substrate 801.

Referring again to FIG. 5, once the first surface is over-molded (step 507), a second surface of the lead-frame substrate is etched (step 509). As a result of step 509, at least one free-standing RF interconnect surrounded by the at least one shield ring is defined in the lead-frame substrate. This free-standing interconnect and shield ring are held in place by the suitable encapsulate disposed on the first surface. As with step 505, the etching process of step 509 may be performed by and means known in the art as discussed above. It should be noted that the at least one free-standing interconnect and the at least one shield ring do not have to be uniform.

Also, as noted above, the at least one shield ring may be etched (steps 505, 509) to be either continuous or split to facilitate molding. Further, the at least one shield ring may be etched (steps 505, 509) either circular or polygonal, depending on design needs for shielding the RF interconnect.

Optionally, the etched second surface (e.g., top surface step 509) of the lead frame substrate may be over-molded following its etching in the same way the etched first surface (e.g., bottom surface) of the lead frame substrate was over-molded (step 507). A double-molded lead frame substrate provides added rigidity and strength to the lead frame substrate during manufacture. It also facilitates a final over-molding step (513), as small voids created by etching the top surface may be filled without obstruction from, for example, a flip chip or other components.

Figure 9:
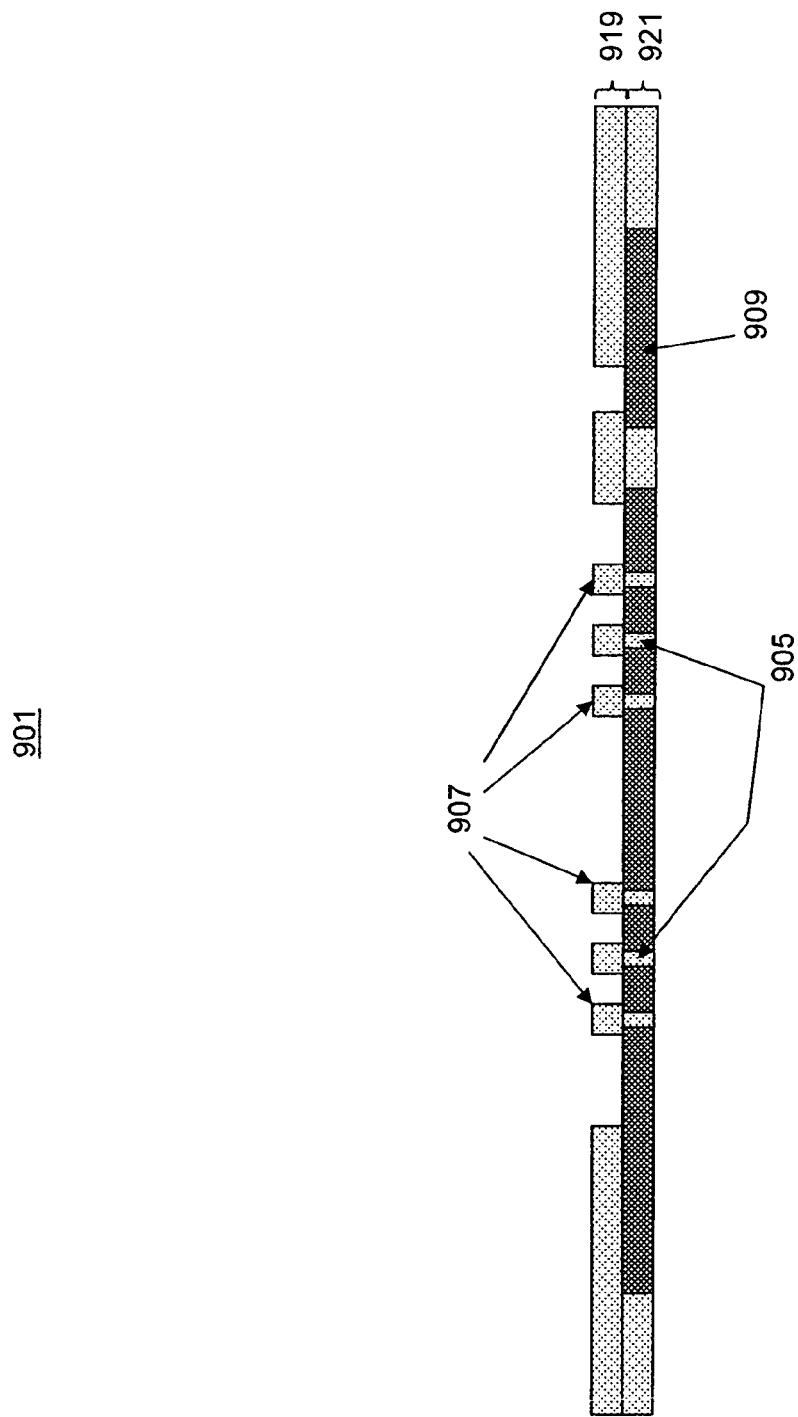
FIG. 9 illustrates an exemplary lead-frame substrate with an etched and molded first surface and an etched second surface, thereby defining at least one free-standing RF interconnect that is surrounded by at least one shield ring.

Referring now to FIG. 9, an exemplary lead-frame substrate 901 with an etched and molded first surface 921 and an etched second surface 919 (e.g. top surface), thereby defining at least one free-standing RF interconnect 905 that is surrounded by at least one shield ring 907, is shown. The at least one free-standing RF interconnect 905 and the at least one shield ring 907 are held in place by a suitable encapsulate 909 disposed on a first surface 921 (e.g. bottom surface) of the substrate 901.

Referring again to FIG. 5, the method 501 includes mounting at least one flip chip to the second surface of the lead-frame substrate (step 511). The flip chip may be mounted by any means known in the art. Preferably, an RF lead of the at least one flip chip located in a flip chip bump may be coupled to the at least one free-standing RF interconnect, and a ground lead of the at least one flip chip located in a flip chip bump may be coupled to the at least one shield ring. The grounded shield provides protection for the free standing RF I/O thereby minimizing losses, inductance, leakage, and crosstalk, and improving performance.

The flip chip may be coupled by any means known in the art, such as for example, applying an adhesive to the lead-frame substrate via one of printing solder paste, dispensing solder paste, printing conductive epoxy, transferring a patterned sheet adhesive, and dispensing conductive epoxy onto the lead-frame substrate for use in mounting the at least one flip chip. Alternatively, the coupling means may be one of soldering, brazing, welding, conductive epoxy die attach bonding, thermocompression, thermosonic, and ultrasonic bonding.

The flip chip mounted in step 511 may be any suitable flip chip known in the art, such as for example, an integrated circuit (IC). As such, the IC may any suitable IC known in the art, such as for example, a Monolithic Microwave Integrated Circuit ("MMIC"). In addition to mounting at least one flip chip to the second surface of the lead-frame substrate (step 511), other package components may be mounted to the second surface of the lead frame substrate. These package components may be any suitable components known in the art, such as for example, a capacitor, a resistor, an inductor, etc. The added package components may be used, for example, to improve performance of the package.

As noted above, the etched second surface of the lead frame substrate may be over-molded before mounting the flip chip to provide a double-molded lead frame substrate. Alternatively or additionally, the etched second surface may be underfilled after the flip chip and/or other components have been mounted to the second surface (step 511). Underfilling refers to adding a suitable encapsulate in the area between the flip chip and the lead frame substrate. The underfilling facilitates manufacturing by strengthening the connection between the flip chip and lead frame substrate before over-molding. It also facilitates over-molding step 513 by pre-filling the void between the flip chip and lead frame substrate. The underfill may be any suitable encapsulate known in the art, such as for example, plastic, elastomer, polymer, polymer matrix composite, co-polymer, etc.

Referring now to FIG. 10, a flip chip 1011 mounted to an exemplary lead-frame substrate 1001 is shown. The flip chip 1011 may be mounted by aligning flip chip bumps 1035 to a coupling means 1037. Preferably, an RF lead 1039 of the at least one flip chip 1011 located in a flip chip bump 1035 is preferably coupled to the at least one free-standing RF interconnect 1005, and a ground lead 1041 of the at least one flip chip 1011 located in a flip chip bump 1035 is preferably coupled to the at least one shield ring 1007. As will be described subsequently, the overmolding (not shown in this view) may be etched to expose the backside of the flip chip or the backside of the flip chip may be left exposed to allow the optional application of a heat sink 1050 to the exposed backside of the flip chip.

Referring again to FIG. 5, once a flip chip and other components are mounted (step 511), the flip chip, optional component, and the etched second surface (step 513) is over-molded (step 513), thus providing a flip chip shielded RF I/O land grid array package. This over-molding may be followed by a back-grinding step to expose a back side of the flip chip. This optional back-grinding step enables a heat sink to be applied to the exposed back side of the flip chip to help cool the flip chip and package while running. Alternatively, overmolding (step 513) may be accomplished such that the back side of the flip chip remains exposed. In this manner, a heat sink may be applied to the exposed back side of the flip chip without requiring a back-grinding step.

Optionally, step 513 may be followed by etching and molding the first surface of the lead frame substrate if so desired. In other words, the aforementioned steps 505 (etching a first surface of the lead-frame substrate) and 507 (over-molding the etched first surface) may be performed following step 513, rather that before step 509, to then provide the flip chip shielded RF I/O land grid array package.

It should be noted that more than one lead frame may be provided to make more than one package at a time. In such an embodiment, a plurality of lead frames are provided and separated by saw streets as is known in the art. A plurality of packages may be simultaneously manufactured by performing the steps of method 501. Following over-molding step 513, individual packages may be excised along the saw streets. In this manner, manufacturing of multiple packages is facilitated by allowing more packages to be provided with less time. Further, less waste may occur because encapsulate run off provides encapsulate to other packages.

A variety of modifications to the embodiments described will be apparent to those skilled in the art from the disclosure provided herein. Thus, the invention may be embodied in other specific forms without departing from the spirit or essential attributes thereof and, accordingly, reference should be made to the appended claims, rather than to the foregoing specification, as indicating the scope of the invention.

I claim:

1. A shielded land grid array package, comprising:
   a lead-frame substrate defining at least one free-standing radio frequency (RF) interconnect surrounded by at least one shield ring, the at least one free-standing RF interconnect being held in place by a first encapsulate;
   at least one flip chip mounted to the at least one free-standing RF interconnect wherein a flip chip RF lead couples to the at least one free-standing RF interconnect and a flip chip ground lead couples to the shield ring; and
   a second encapsulate disposed over the lead frame substrate, the at least one free-standing RF interconnect, and the at least one flip chip.

2. The package of claim 1, wherein the lead-frame substrate is made of a metal selected from the group consisting of copper, copper alloy, nickel-iron alloy, and nickel-cobalt alloy.

3. The package of claim 1, further comprising a slot in a surface of the lead-frame substrate for facilitating bonding of the second encapsulate.

4. The package of claim 1, wherein the shield ring is defined as a continuous shield ring.

5. The package of claim 1, wherein the shield ring is defined as a split shield ring.

6. The package of claim 1, wherein the shield ring is circular in shape.

7. The package of claim 1, wherein the shield ring is polygonal in shape.

8. The package of claim 1, wherein the flip chip is an Integrated Circuit (IC).

9. The package of claim 1, further comprising at least one package component mounted to the lead-frame substrate.

10. The package of claim 1, further comprising an underfill disposed between the lead-frame substrate and the at least one flip chip.

11. The package of claim 1, further comprising a third encapsulate disposed between the lead frame substrate and the at least one flip chip.

12. The package of claim 1, further comprising at least one heat sink on the at least one flip chip.

13. The package of claim 1, wherein the first encapsulate comprises a same material as the second encapsulate.

14. The package of claim 1, wherein the first encapsulate comprises a different material from the second encapsulate.

* * * * *